United States Patent
Konishi et al.

(10) Patent No.: US 6,949,835 B2
(45) Date of Patent: Sep. 27, 2005

(54) SEMICONDUCTOR DEVICE

(75) Inventors: Satoru Konishi, Saku (JP); Tsuneo Endoh, Komoro (JP); Hirokazu Nakajima, Saku (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/809,450

(22) Filed: Mar. 26, 2004

(65) Prior Publication Data

US 2004/0188854 A1 Sep. 30, 2004

(30) Foreign Application Priority Data

Mar. 26, 2003 (JP) ........................................ 2003-084738

(51) Int. Cl.$^7$ .............................................. H01L 23/48
(52) U.S. Cl. ........................ 257/777; 257/773; 257/774; 257/776; 257/778
(58) Field of Search .................................. 257/777, 778

(56) References Cited

U.S. PATENT DOCUMENTS

2002/0027295 A1 * 3/2002 Kikuma et al. ............. 257/780
2002/0041027 A1 * 4/2002 Sugizaki ..................... 257/737

FOREIGN PATENT DOCUMENTS

JP 07-058280 3/1995

* cited by examiner

*Primary Examiner*—Andy Huynh
(74) *Attorney, Agent, or Firm*—Antonelli, Terry, Stout & Kraus, LLP.

(57) ABSTRACT

The size of a power amplifier module is reduced. The power amplifier module includes a module substrate, a lower chip flip-connected to the module substrate, an upper chip stacked face up onto the lower chip, a common electrode disposed on a back surface of the upper chip, plural wires for connecting the upper chip and the module substrate with each other, plural wires for connecting the common electrode and the module substrate with each other, plural chip parts mounted on the module substrate, and a sealing portion formed on the main surface of the module substrate. The common electrode is connected to the module substrate through wires to strengthen the GND of the upper chip. Since the lower chip is flip-connected to the module substrate, the difference in size between the upper and lower chips is diminished to attain a reduction in size of the power amplifier module.

13 Claims, 6 Drawing Sheets

SEMICONDUCTOR DEVICE

CROSS-REFERENCE TO RELATED APPLICATION

The present application claims priority from Japanese patent application JP 2003-084738, filed on Mar. 26, 2003, the content of which is hereby incorporated by reference into this application.

BACKGROUND OF THE INVENTION

The present invention relates to a semiconductor device, and, more particularly, to a technique which is effective in achieving a reduction in the size of a module, such as a power amplifier module.

As a structure for achieving a reduction in the size of a semiconductor device, there is a known SCP (Stacked Chips Package) structure in which semiconductor chips are arranged in a superimposed fashion. In the SCP structure, a lower-layer chip is provided, and an upper-layer chip that is smaller than the lower-layer chip is superimposed on the lower-layer chip. Thus, the chips are stacked in two stages so as to attain a reduction in size (see, for example, Patent Literature 1).

Patent Literature 1:

Japanese Patent Publication Laid-Open No. Hei 7(1995)-58280 (page 3, FIG. 2)

SUMMARY OF THE INVENTION

Many electronic parts are incorporated in a communication terminal, such as a portable telephone, and there have been rapid advances toward a reduction in size and a higher performance with respect to a high frequency amplifier (power amplifier module) that is incorporated in a transmission system of the portable telephone. As one example of such communication systems, there is the known GSM (Global System for Mobile Communications).

At present, the external size of a power amplifier module for use in the GSM system is 10 mm long by 8 mm wide, but as to the next-generation module, it is presumed that a size of 6 mm long by 5 mm wide be employed.

Also, in the field of CDMA (Code Division Multiple Access), it can be presumed that there will be a demand for successively smaller sizes from the present size of 6 mm long by 6 mm wide to a size of 5 mm long by 5 mm wide, and, further, to a size of 4 mm long by 4 mm wide.

In such an ultra-small-sized power amplifier module, with only a two-dimensional surface mounting of components on a module board of a printed wiring board (PWB), semiconductor chips with active elements, such as transistors, incorporated therein, as well as passive elements as chip parts, such as resistors (chip resistors) and capacitors (chip capacitors), can no longer be mounted, so that a three-dimensional packaging becomes necessary.

For attaining a reduction in the size of a power amplifier module, the present inventors have made studies concerning a stacked structure of semiconductor chips, and, as a result, the following problems have been discussed.

If a stacked structure of semiconductor chips is adopted in a power amplifier module, then as to an upper chip which is disposed on a lower chip, it is difficult to provide a GND (ground) connection is difficult to be done on the back side of the chip, and, therefore, it is difficult to ensure a large area of GND with respect to the upper chip. Thus, for example, in the case where a power amplifier module has amplifier circuits which amplify an input signal in three stages, it is only the first-stage of an amplifier circuit that can be incorporated in an upper-stage chip.

As a result, the second- and third-stage amplifier circuits are incorporated in a lower chip, with the result that the difference in size between the upper- and lower-stage chips becomes large and both are unbalanced in size, thus giving rise to the problem that it is impossible to attain a satisfactory reduction in the size of the module.

Further, since the size of the upper-stage chip is small, the wire length becomes large, that is, it becomes difficult to carry out the assembling process.

It is an object of the present invention to provide a semiconductor device in which it is possible to achieve a reduction in size.

It is another object of the present invention to provide a semiconductor device which has an improved reliability.

It is a further object of the present invention to provide a semiconductor device capable of easy assembly The above and other objects and novel features of the present invention will become apparent from the following description and the accompanying drawings.

The following is a brief description of a typical example of the present invention as disclosed herein.

According to the present invention, there is provided a semiconductor device including a first semiconductor chip having elements formed on a first semiconductor substrate; a second semiconductor chip having elements formed on a second semiconductor substrate; a wiring substrate having a main surface and a back surface, the second semiconductor chip being mounted on the main surface of the wiring substrate, and the first semiconductor chip being stacked on the second semiconductor chip; and an electrode of a fixed potential disposed on the first semiconductor chip on the side opposed to the second semiconductor chip, the electrode of the fixed potential being electrically connected to the semiconductor substrate of the first semiconductor chip and to the wiring substrate.

DETAILED DESCRIPTION OF THE PREFERRED EMBODIMENTS

Figure 1:
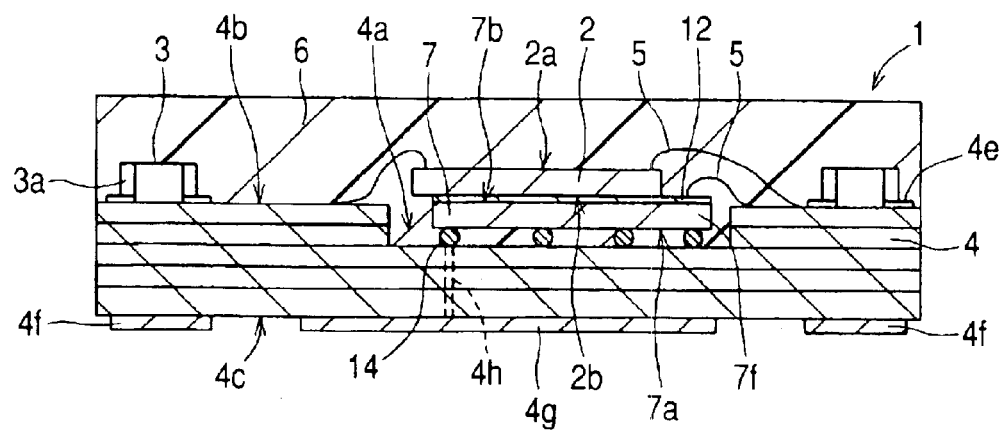
FIG. 1 is a sectional view showing the structure of a power amplifier module representing an example of a semiconductor device according to a first embodiment of the present invention.

Embodiments of the present invention will be described in detail hereinunder with reference to the accompanying drawings.

When required for convenience' sake, the embodiments will be described by dividing them into plural sections or by considering the embodiments as a whole, but unless otherwise mentioned, they are not unrelated to each other, but are in a relation such that one is a modification, a description of details, or a supplementary explanation, of part or the whole of the other.

In the following description of the embodiments, when reference is made to a number of elements (including the number, numeral value, quantity, and range), it is to be understood that the invention is not limited to the number referred to, but numerals above and below the number referred to will do as well, unless otherwise mentioned, and except in the case where it is basically evident that a limitation applies to the number referred to.

It goes without saying that in the following description of the embodiments, all constituent elements (including constituent steps) are not always essential, unless otherwise mentioned, and except in the case where they are obviously considered essential.

Likewise, it is to be understood that when reference is made to specific shapes and a positional relation of components in the following description of the embodiments, those substantially closely similar to or resembling such shapes, etc. are also included, unless otherwise mentioned, and except in the case where the opposite is basically obvious.

In all of the drawings, portions having the same functions are identified by like reference numerals, and repeated explanations thereof will be omitted.

(First Embodiment)

A first embodiment of the present invention will be described with reference to FIGS. 1–7 of the drawings.

Figure 2:
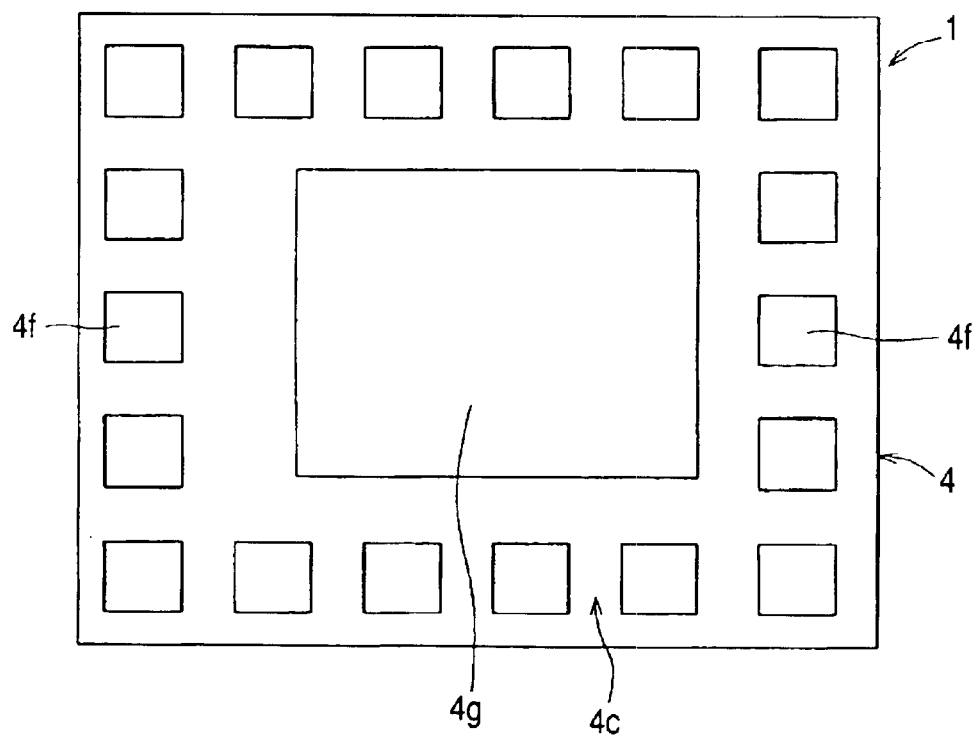
FIG. 2 is a plan view showing the back of the power amplifier module of FIG. 1.

The semiconductor device of the first embodiment, as shown in FIGS. 1 and 2, is a high frequency module called a power amplifier module 1, having a stacked chip structure, in which a second semiconductor chip is mounted on a main surface 4b of a module substrate (wiring substrate) 4, and a first semiconductor chip is superimposed on the second semiconductor chip. The semiconductor device of the first embodiment is used mainly in a small-sized portable electronic device, such as a portable telephone.

For example, the power amplifier module 1 is a high frequency amplifier which amplifies high frequencies (e.g., about 900 MHz and about 1800 MHz) in a portable telephone in plural stages.

The power amplifier module 1 of this first embodiment comprises a quadrangular module substrate 4, a sealing layer 6 formed superimposedly on the main surface 4b of the module substrate 4, and plural external terminals 4f and an external terminal 4g for GND, which are formed on a back surface 4c of the module substrate 4.

In assembling the power amplifier module 1, electronic parts, including semiconductor chips, are mounted in a multi-substrate array comprising plural module substrates 4 arranged side by side, then a sealing resin layer is formed at a predetermined certain height on an upper surface of the multi-substrate array so as to cover the electronic parts; and, thereafter, the multi-substrate array, including the sealing resin layer superimposed thereon, is cut longitudinally and transversely to obtain plural individual power amplifier modules 1. Consequently, a structure is obtained wherein the side faces of each module substrate 4 and the side faces of the sealing layer 6 are aligned with each other, and end portions of the sealing layer 6 are not positioned outside end portions of the module substrate 4.

The module substrate 4 is constituted by a printed wiring substrate, and it has, for example, a structure formed as a lamination of plural dielectric layers (insulating films). Conductor layers of predetermined wiring patterns are formed on the main surface 4b and the back surface 4c and also in the interior, the conductor layers on the main surface 4b and the back surface 4c being electrically connected with each other through via holes 4h or the like extending in the thickness direction of the substrate. In this first embodiment, the dielectric layers are formed as five layers, though no limitation is made thereto.

Figure 3:
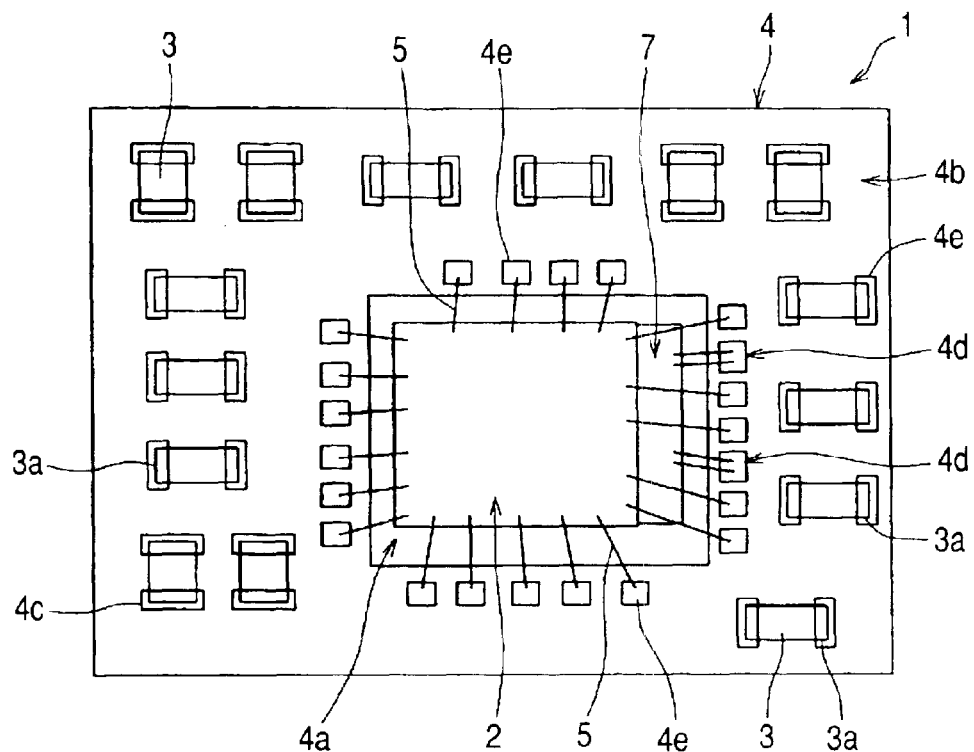
FIG. 3 is a planar layout diagram showing an example of the layout of parts mounted on a main surface of a wiring substrate in the power amplifier module of FIG. 1.

The detailed configuration of the power amplifier module 1 of this first embodiment will now be described. The power amplifier module 1 comprises a module substrate 4, serving as a wiring substrate, having a main surface 4b and a back surface 4c on the side opposite to the main surface; a lower chip 7, serving as a second semiconductor chip, having elements formed on a semiconductor substrate 13, the lower chip 7 being mounted on the main surface 4b of the module substrate 4; an upper chip 2, serving as a first semiconductor chip, having elements formed on a semiconductor substrate 13, the upper chip 2 being superimposed on the lower chip 7; a common electrode 12 of a fixed potential disposed on a back surface 2b of the upper chip 2; a plurality of electrically conductive wires 5 for connecting the upper chip 2 and the module substrate 4 electrically with each other; a plurality of chip parts 3, which serve as passive parts, mounted around the lower chip 7 and upper chip 2 on the module substrate 4, as shown in FIG. 3; and a sealing portion 6 formed so as to cover the lower chip 7, the upper chip 2, the plural wires 5 and the plural chip parts 3 on the main surface 4b side of the module substrate 4. The common electrode 12 of fixed potential is electrically connected to both the semiconductor substrate 13 of the upper chip 2 and the module substrate 4.

The back surface 2b of the upper chip 2, which is the side opposite to the main surface 2a to which the wires 5 are connected, is opposed to the lower chip 7. As shown in FIG. 1, the lower chip 7 is mounted by flip connection (also called flip chip connection) in a cavity 4a, which appears as a recess formed in the module substrate 4, and it is electrically connected to the module substrate 4 through bump electrodes 14.

The lower chip 7 is thus disposed in the cavity 4a, which is formed in the main surface 4b of the module substrate 4. More specifically, the lower chip 7 is mounted face down onto the module substrate 4 so that its main surface 7a becomes opposed to the module substrate 4. The lower chip 7 is electrically connected to the module substrate 4 through bump electrodes 14, such as gold bumps, for example.

The upper chip 2 is mounted on a back surface 7b of the lower chip 7 in a stacked state and is oriented with its main surface 2a facing up. Since the main surface 2a of the upper chip 2 thus faces up, the upper chip 2 is electrically connected to terminals 4e of the module substrate 4 through wires 5, such as gold wires, as shown in FIG. 3.

Figure 4:
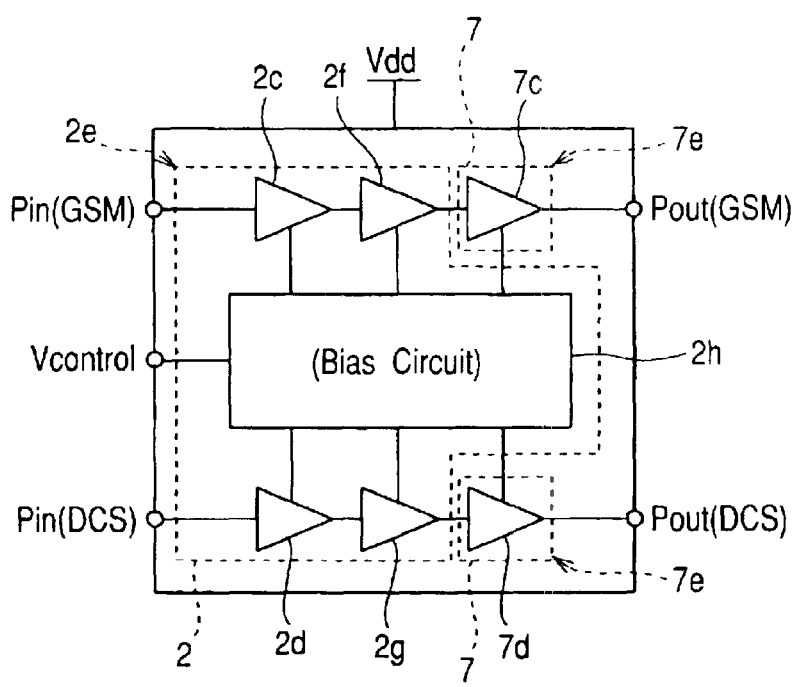
FIG. 4 is a circuit block diagram showing an example of a high frequency amplifier circuit incorporated in the power amplifier module.

Next, a description will be given of a high frequency amplifier circuit block, as shown in FIG. 4, in the power amplifier module of this first embodiment.

In the high frequency amplifier circuit, respective input signals in two frequency bands are amplified. Amplification is carried out in three stages in each of the two amplifier circuits. The amplifier circuit in each stage is controlled by a control IC (Integrated Circuit) 2h, which is a bias circuit incorporated in the upper chip 2. In the power amplifier module of this first embodiment, the first- and second-stage amplifier circuits, of the three-stage amplifier circuits, are built in the upper chip 2, while the last-stage (third-stage) amplifier circuit is built in the lower chip 7.

A description will now be given of the two frequency bands at which the power amplifier module 1 operates. One frequency band is based on the GSM (Global System for Mobile Communication) standard, which uses a frequency band of 880 to 915 MHz, while the other frequency band is based on the DCS (Digital Communication System 1800) standard, which uses a frequency band of 1710 to 1785 MHz. The power amplifier module 1 is adapted to both standards.

In the power amplifier module 1, as shown in FIG. 4, the high frequency amplifier circuit is divided into two circuit blocks 2e and 7e, shown as enclosed with dotted lines, and the upper chip 2 includes the circuit block 2e, while the lower chip 7 includes the circuit block 7e.

More specifically, in the power amplifier module 1 of this first embodiment, the first-stage and second-stage amplifier circuits, which are relatively low in power consumption, are incorporated as the circuit block 2e into the upper chip 2, while the last-stage (third-stage) amplifier circuit, which is high in power consumption, is incorporated as the circuit block 7e into the lower chip 7.

Corresponding to the circuit blocks 2e and 7e, a GSM-side first-stage amplifier 2c, a GSM-side second-stage amplifier 2f, a DCS-side first-stage amplifier 2d, and a DCS-side second-stage amplifier 2g, are incorporated in the upper chip 2; while, a GSM-side last-stage (third-stage) amplifier 7c and a DCS-side last-stage (third-stage) amplifier 7d are incorporated in the lower chip 7.

Upon receipt of a control signal Vcontrol, the control IC 2h, which is incorporated in the upper chip 2, controls the power of each of the GSM-side first-stage, second-stage and last-stage amplifiers 2c, 2f, 7c, and it also controls the power of each of the DCS-side amplifiers. In the power amplifier module 1 of this first embodiment, MOSFETs (Metal Oxide Semiconductor Field Effect Transistors) are used as amplifier elements, and, in this case, the upper chip 2 controls the bias applied to the gate of each MOSFET, thereby controlling the power of outputs Pout (GSM) and Pout (DCS).

Figure 5:
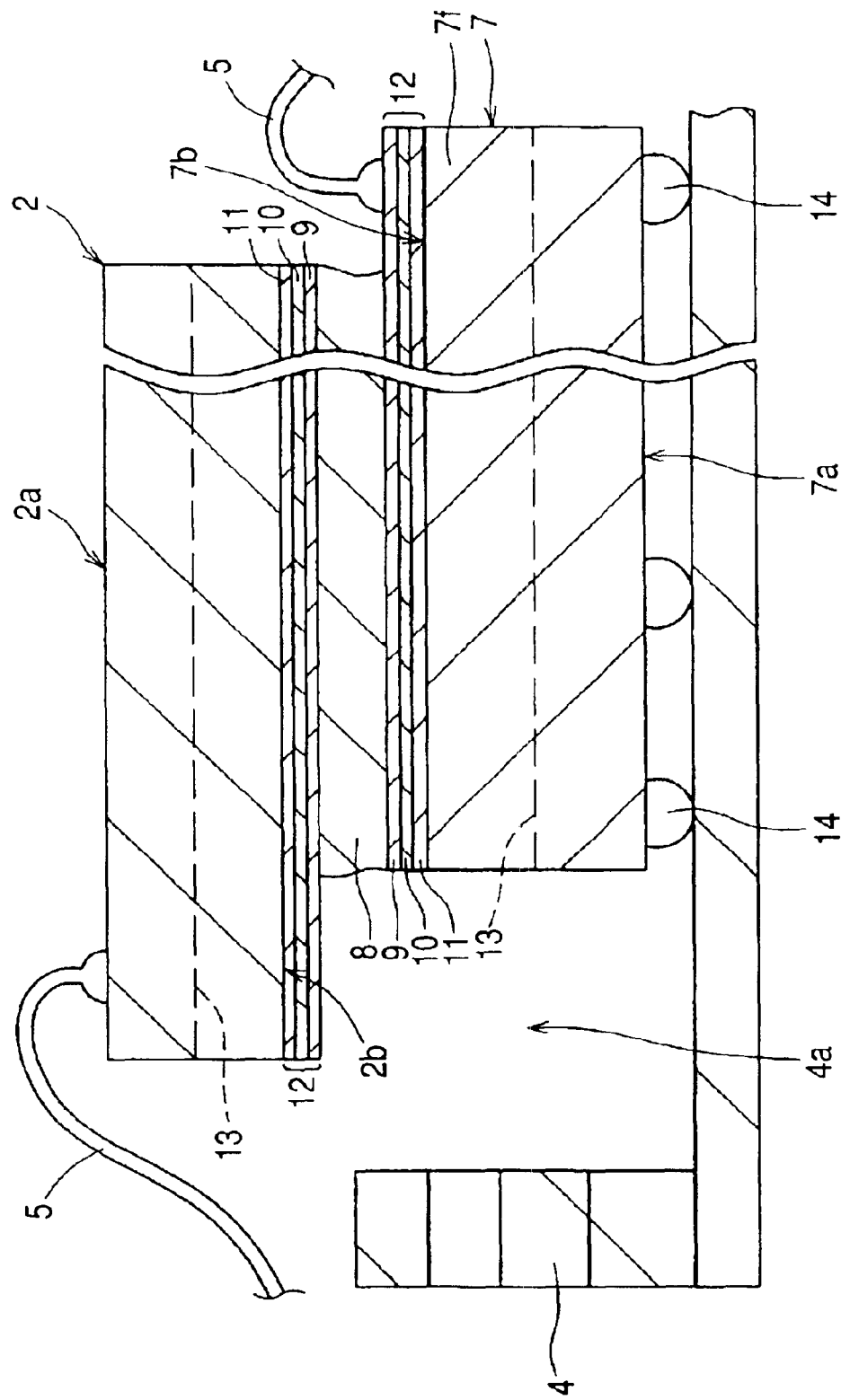
FIG. 5 is an enlarged partial sectional view showing the structure of a bonded portion between a first semiconductor chip and a second semiconductor chip in the power amplifier module.
Figure 6:
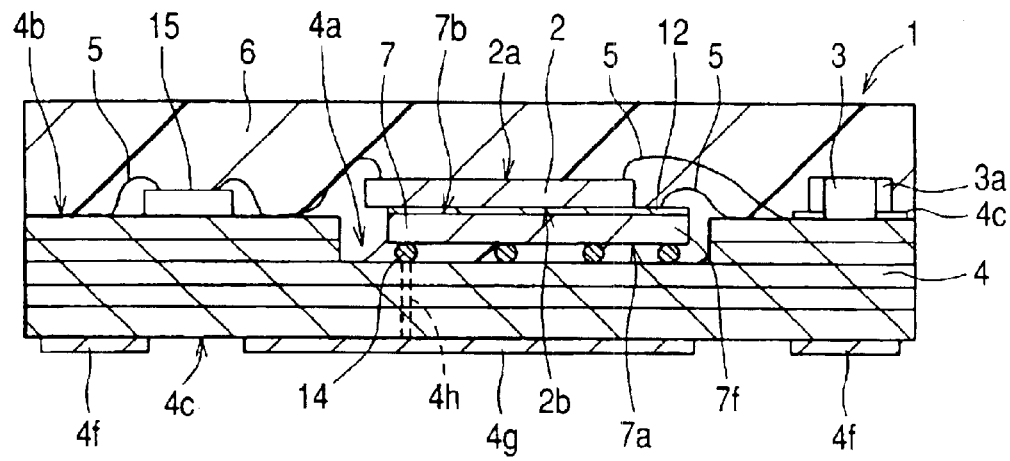
FIG. 6 is a sectional view showing the structure of a power amplifier module according to a modification of the first embodiment.

In the power amplifier module 1, as shown in FIG. 5, a common electrode 12 of a fixed potential is provided on each of the back surfaces 2b and 7b of the upper and lower chips 2, 7. More specifically, a common electrode 12 having a large area is formed throughout the area of each of the back surface 7b of the lower chip 7, whose back surface is opposed to the upper chip 2, and the back surface 2b of the upper chip 2, whose back surface is opposed to the lower chip 7. In this case, since the upper chip 2 is stacked face up onto the back surface 7b of the lower chip 7, the back surfaces of both chips confront each other, and, in this state, the common electrode 12 formed on the back surface 7b of the lower chip 7 and the common electrode 12 formed on the back surface 2b of the upper chip 2 are electrically connected with each other using an electrically conductive paste 8, such as Ag paste.

Thus, as a fixed potential electrode having a large area, a common electrode 12 can be disposed between the upper and lower chips 2, 7; and, by allowing the common electrode 12 to serve as a GND electrode, it is possible to provide a GND electrode of large area between the upper and lower chips 2, 7.

As shown in FIGS. 1 and 5, the lower chip 7 has a projecting portion 7f projecting beyond the edge of the upper chip 2, and the common electrode 12 is also located on the projecting portion 7f of the lower chip 7. The common electrode 12 on the projecting portion 7f and GND terminals 4d on the module substrate 4 shown in FIG. 3 are connected together for grounding through electrically conductive gold wires 5.

As shown in FIG. 5, gold wires 5 are connected onto the projecting portion 7f of the lower chip 7, and, therefore, it is preferable that a Au (gold) plating film 9 be formed as a surface layer in the common electrode 12. For example, the common electrode 12 comprises a Ti (titanium) plating film 11 as an undercoat layer, a Ni (nickel) plating film 10 as an intermediate plating layer, and a Au plating film 9 as a surface plating layer. Thus, the common electrode 12 has a three-layer plating film structure.

For grounding of the lower chip 7, as seen in FIG. 1, a predetermined bump electrode 14 for GND is connected to an external terminal 4g for GND on the back surface 4c through a via 4h for GND formed in the module substrate 4, and thus, the GND connection of the lower chip 7 is strengthened. That is, GND of the lower chip 7 and GND of the common electrode 12 on the upper chip 2 are not common to each other. However, in the case where the grounding through the predetermined bump electrode 14 is not sufficient for the grounding of the lower chip 7, a configuration may be adopted which uses both a GND through the predetermined bump electrode 14 on the main surface 7a side of the lower chip 7 and a GND using the common electrode 12 on the back surface 7b side.

In the power amplifier module 1 of this first embodiment, by adopting the foregoing stacked chip structure, the GND of the upper chip 2 is connected to the module substrate 4 through the common electrode 12, which is disposed on the back surface 2b of the upper chip 2, and further through wires 5 connected to the common electrode 12, and thus the GND connection can be strengthened. Accordingly, the first-stage and second-stage amplifier circuits, i.e., the first-stage and second-stage amplifiers 2c, 2f on the GSM side and the first-stage and second-stage amplifiers 2d, 2g on the DCS side can be incorporated in the upper chip 2.

Consequently, it is only the last-stage (third-stage) amplifier 7c on the GSM side and the last-stage (third-stage) amplifier 7d on the DCS side that are incorporated as amplifier elements (amplifier circuits) into the lower chip 7. As a result, it is possible to make the upper chip 2 larger in size than a conventional chip and to make the lower chip 7 smaller in size than a conventional like chip. That is, the difference in size between both chips can be made smaller than has been employed heretofore.

As to the projecting portion 7f of the lower chip 7, which projects beyond from the upper chip 2, it suffices for the projecting portion 7f to have an area to be used for connection thereto of the wires 5. It is preferable that the difference in size between the upper chip 2 and the lower chip 7 be as small as possible and that the ratio in projected area between the main surfaces 7a and 2a be in the range from 0.9 to 1.1. If these preferred conditions are satisfied, in the power amplifier module 1 of this first embodiment, it is possible to make both the upper and the lower chips 2, 7 almost equal in size. As a result, it is possible to reduce the area and, hence, reduce the size of the power amplifier module 1.

Moreover, since the size of the upper chip 2 can be made larger than has been employed heretofore, the length of the wires 5 for the upper chip 2 can be made short, and, as a result, it is possible to improve the assemblability of the power amplifier module 1.

Further, since the common electrode 12, which serves as a GND electrode having a large area, is disposed between the upper and lower chips 2, 7, it is possible to improve the effect of the electromagnetic shielding between both chips, and, hence, it is possible to prevent interference between the first-/second-stage amplifiers and the last-stage (third-stage) amplifier. That is, it is possible to strengthen the electromagnetic shielding between the control circuit, as well as the first- and second-stage amplifier circuits, and the third-stage amplifier circuit. Hence, it is possible to prevent the occurrence of certain inconveniences, such as oscillation in a frequency band other than the predetermined frequency band. Consequently, it is possible to improve the reliability of the power amplifier module 1.

Further, since the GND connection of the upper chip 2 is strengthened and stabilized by the common electrode 12, even if the second-stage amplifier circuit is incorporated in the upper chip 2, the GND connection of the upper chip 2 does not become unstable, and it is possible to improve the reliability of the power amplifier module 1.

Plural chip parts 3 which serve as passive parts mounted around the semiconductor chip on the main surface 4b of the module substrate 4, for example, consist of chip resistors and chip capacitors, and connecting terminals 3a formed at both ends of the chip components are connected, for example, by soldering to the terminals 4e formed on the module substrate 4.

A power amplifier 1 according to a modification of the first embodiment will now be described. In the power amplifier module 1 shown in FIG. 6, an IPD (Integrated Passive Device) chip 15 that is formed by plural chip parts 3 which serve as components is mounted on a module substrate 4. More specifically, a single IPD chip 15 incorporating plural elements, such as resistor, capacitor and inductance elements, is mounted on the module substrate 4, whereby the number of chip parts 3 mounted on the module substrate 4 is decreased, thereby permitting a further reduction in the size of the power amplifier module 1.

Since such elements as resistor, capacitor and inductance elements are incorporated in the IPD chip 15, there is adopted a glass substrate is used, for example, and the elements are formed on the glass substrate.

In a power amplifier module 1 according to another modification of the first embodiment, the module substrate 4 does not have the cavity 4a as shown in FIG. 1, but has a flat main surface 4b.

A lower chip 7 is flip-connected to the flat main surface 4b of the module substrate 4 and an upper chip 2 is stacked face up onto the lower chip 7. Thus, the power amplifier module 1 of FIG. 7 has a stacked chip structure.

Figure 7:
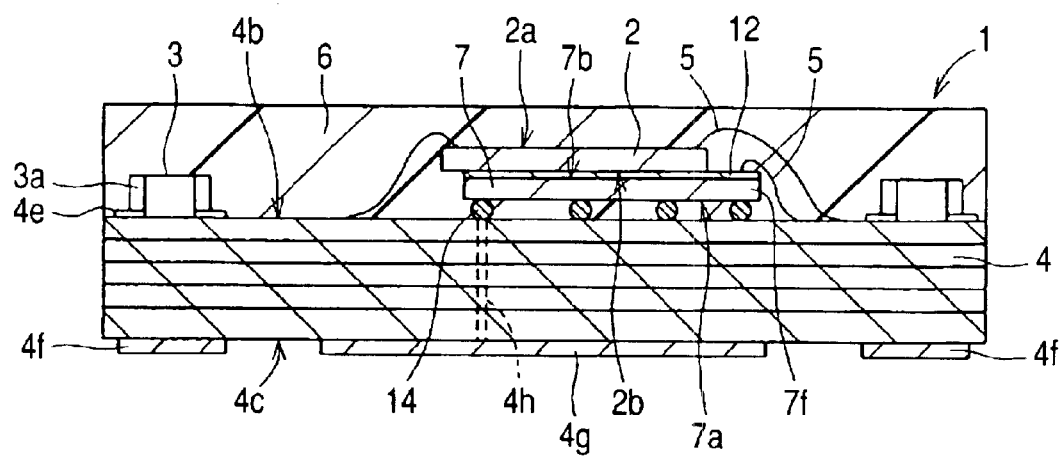
FIG. 7 is a sectional view showing the structure of a power amplifier module according to another modification of the first embodiment.

In the power amplifier module 1 shown in FIG. 7, the shape of the module substrate 4 illustrated therein can be obtained easily, so that it is possible to reduce the cost of the module substrate 4 and, hence, reduce the cost of the power amplifier module 1.

(Second Embodiment)

Figure 8:
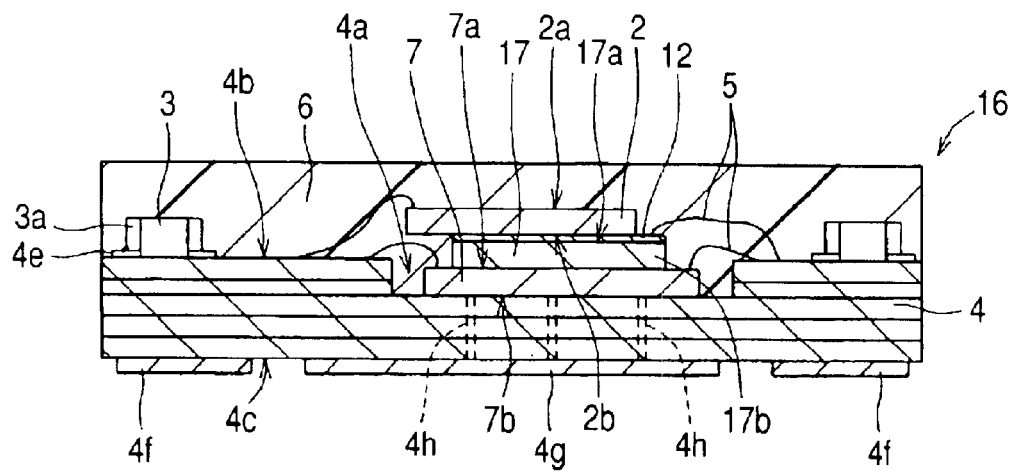
FIG. 8 is a sectional view showing the structure of a power amplifier module representing an example of a semiconductor device according to a second embodiment of the present invention.
Figure 9:
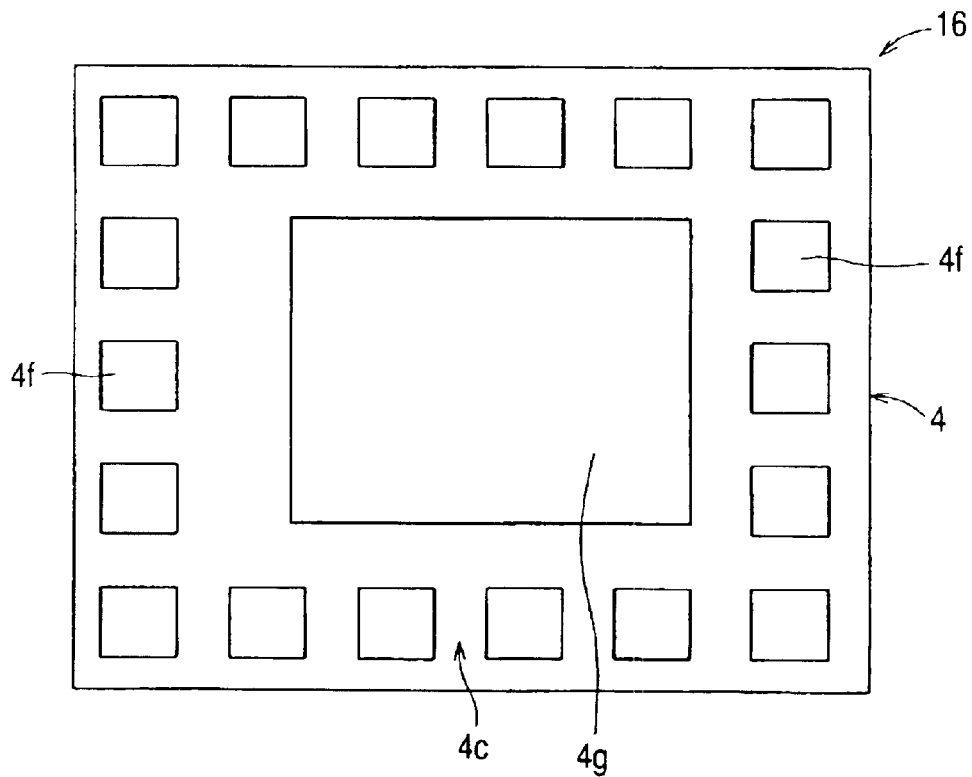
FIG. 9 is a plan view showing the back of the power amplifier module of FIG. 8.
Figure 10:
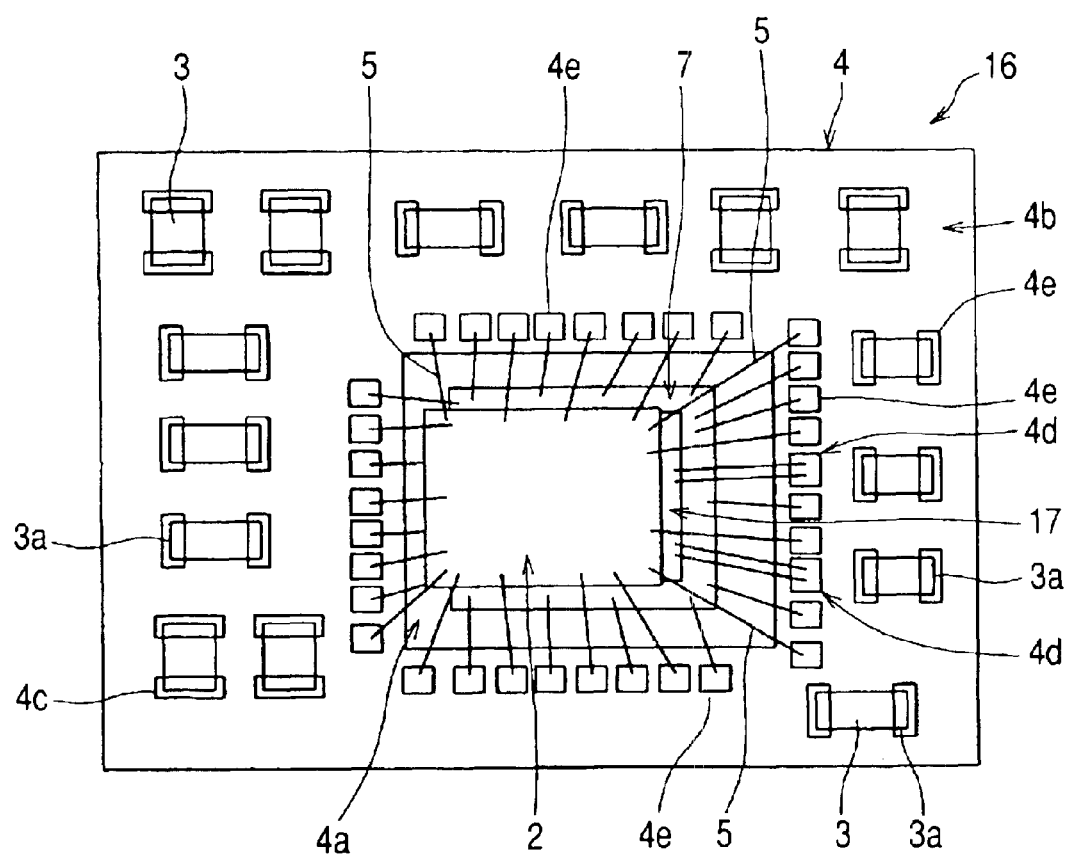
FIG. 10 is a planar layout diagram showing an example of the layout of parts mounted on a main surface of a wiring substrate in the power amplifier module of FIG. 8.

FIG. 8 is a sectional view showing the structure of a power amplifier module as an example of a semiconductor device according to a second embodiment of the present invention; FIG. 9 is a back view thereof; and FIG. 10 is a planar layout diagram showing an example of the layout of parts mounted on a main surface of a wiring substrate in the power amplifier module.

As is the case with the first embodiment, the semiconductor device of this second embodiment is a power amplifier module 16. The power amplifier module 16 is different from the power amplifier module 1 of the first embodiment in that the lower chip (second semiconductor chip) 7 is mounted face up on the module substrate 4, and the upper chip (first semiconductor chip) 2 is stacked face up on the lower chip, with a spacer 17 being disposed between the lower chip 7 and the upper chip 2.

More specifically, the lower chip 7 is mounted face up on the module substrate 4 by soldering, and the upper chip 2 is stacked face up on the upper chip 2 with the spacer 17 disposed itherebetween. Further, since both lower and upper chips 7, 2 are mounted face up, both are connected to the module substrate 4 through electrically conductive wires 5, such as gold wires.

As is the case with the power amplifier module 1 of the first embodiment, a common electrode 12, which serves as an electrode of a fixed potential, is formed on a back surface 2b of the upper chip 2, and a common electrode 12 is formed also on the main surface 17a of the spacer 17 whose main surface is opposed to the upper chip 2, both common electrodes 12 being connected together using Ag paste 8 (see FIG. 5) as in the first embodiment. Therefore, a semiconductor substrate 13 (see FIG. 5) of the upper chip 2 is electrically connected to the common electrodes 12.

The common electrodes 12 used in this second embodiment are the same as the common electrodes 12 used in the first embodiment, as illustrated in FIG. 5, and they are provided as GND electrodes having a large area. Further, wires 5 are connected to the common electrode 12 that is formed on a projecting portion 17b of the spacer 17 projecting from the upper chip 2; and, as shown in FIG. 10, the wires 5 are connected to terminals 4d for GND connection formed on the module substrate 4.

Thus, as the GND electrode on the upper chip 2 side, the common electrode 12 of large area formed on the back surface 2b of the upper chip may be employed, and the common electrode 12 and the module substrate 4 are electrically connected with each other through plural wires 5 connected to the common electrode 12.

With the above arrangement, the GND connection of the upper chip 2 can be strengthened as is the case with the power amplifier module 1 of the first embodiment. Further, as in the first embodiment, the common electrode 12 serving as a GND electrode of large area can be disposed between the upper chip 2 and the lower chip 7.

In the power amplifier module 16 of this second embodiment, the lower chip 7 is mounted face up on the module substrate 4; therefore, as shown in FIG. 8, the GND of the lower chip 7 is connected to plural via holes 4h, which are formed in the module substrate 4, through a semiconductor substrate (see FIG. 5) of the lower chip and further through a back surface 7b of the lower chip, to an external terminal 4g for GND formed on a back surface 4c, whereby the GND connection of the lower chip is strengthened.

Although the spacer 17 disposed between the lower chip 7 and the upper chip 2 is formed of silicon, for example, it may be formed of any other insulating material in addition to silicon. The spacer 17 is used for providing spacing between the lower chip 7 and the upper chip 2. By disposing the spacer 17 between both chips, it is possible to prevent contact between the wires 5 connected to the lower chip 7 and the wires 5 connected to the spacer 17, and also to prevent contact of the wires 5 connected to the lower chip 7 with the upper chip 2.

Further, since the connection between the spacer 17 and the lower chip 7 is effected using an insulating adhesive, the GND of the upper chip 2 and the GND of the lower chip 7 are not used in common.

The circuit configuration of the power amplifier module 16 of this second embodiment is the same as that of the power amplifier module 1 of the first embodiment illustrated in FIG. 4. That is, corresponding to circuit blocks 2e and 7e, GSM-side first-stage and second-stage amplifiers 2c, 2f and DCS-side first-stage and second-stage amplifiers 2d, 2g are incorporated in the upper chip 2, while a GSM-side last-stage (third-stage) amplifier 7c and a DCS-side last-stage (third-stage) amplifier 7d are incorporated in the lower chip 7. A control IC 2h is also incorporated in the upper chip 2.

As shown in FIG. 9, as is the case with the power amplifier module 1 of the first embodiment, plural external terminals 4f and an external terminal 4g for GND are formed on the back surface 4c of the module substrate 4 in the power amplifier module 16.

According to the power amplifier module 16 of this second embodiment, the same effects can be obtained as those obtained in the power amplifier module 1 of the first embodiment; besides, since the lower chip 7 is mounted face up on the module substrate 4, the GND of the lower chip 7 can be connected from its back surface 7b side to the external terminal 4g for GND on the back surface 4c through plural via holes 4h formed in the module substrate 4, whereby the GND connection of the lower chip 7 can be further strengthened.

Although the present invention has been described above on the basis of specific embodiments thereof, it goes without saying that the present invention is not limited to the above-described embodiments, and that various changes may be made within a scope not departing from the gist of the invention.

For example, although in the above first and second embodiments reference has been made to the case in which the semiconductor device is a power amplifier module, the semiconductor device may be any other type of module than a power amplifier module, insofar as the module has a structure in which plural semiconductor chips are stacked on the main surface 4b of the module substrate 4. In this case, the number of semiconductor chips to be stacked is not limited to two stages, but may be three or more stages.

Effects obtained by typical examples of the present invention as disclosed herein will be outlined below.

In a stacked chip type semiconductor device, a lower chip is mounted by flip connection, whereby it is possible to eliminate a difference in size between upper and lower chips; and, hence, it is possible to reduce the area of the semiconductor device and attain a reduction in the size of the semiconductor device.

What is claimed is:

1. A semiconductor device comprising:
    a first semiconductor chip with elements formed over a first semiconductor substrate;
    a second semiconductor chip with elements formed over a second semiconductor substrate;
    a wiring substrate including a main surface and a back surface opposite to the main surface,
    the second semiconductor chip being mounted over the main surface of the wiring substrate, and
    the first semiconductor chip being stacked over the second semiconductor chip; and
    an electrode of a fixed potential disposed over a surface of the first semiconductor chip on the side thereof which faces the second semiconductor chip,
    wherein the electrode of a fixed potential is electrically connected to the semiconductor substrate of the first semiconductor chip and to the wiring substrate.

2. A semiconductor device according to claim 1, wherein the second semiconductor chip is flip-connected to the wiring substrate.

3. A semiconductor device according to claim 2, wherein another electrode of a fixed potential is disposed over a surface of the second semiconductor chip on the side thereof which faces the first semiconductor chip.

4. A semiconductor device according to claim 3, wherein the other electrode of a fixed potential and the wiring substrate are connected with each other through an electrically conductive wire.

5. A semiconductor device according to claim 3, wherein the second semiconductor chip includes a projecting portion projecting beyond an edge of the first semiconductor chip in a direction parallel to the main surface of the wiring substrate, the other electrode of a fixed potential is disposed on the projecting portion of the second semiconductor chip, and the electrode of a fixed potential disposed on the projecting portion and the wiring substrate are connected with each other through an electrically conductive wire.

6. A semiconductor device according to claim 3, wherein a gold plating film is formed over a surface of the electrode of a fixed potential.

7. A semiconductor device according to claim 4, wherein the electrically conductive wire is a gold wire.

8. A semiconductor device according to claim 1, further comprising:
    an amplifier circuit for amplifying an input signal in three stages, of which first-stage and second-stage amplifier circuits are incorporated in the first semiconductor chip and a third-stage amplifier circuit is incorporated in the second semiconductor chip.

9. A semiconductor device according to claim 1, wherein the ratio in projected area of each of main surfaces of the first and second semiconductor chips relative to the main surface of the wiring substrate is in the range of 0.9 to 1.1.

10. A semiconductor device comprising:
    a first semiconductor chip with elements formed over a first semiconductor substrate;
    a second semiconductor chip with elements formed over a second semiconductor substrate;
    a wiring substrate including a main surface and a back surface opposite to the main surface,
    the second semiconductor chip being mounted face up over the main surface of the wiring substrate, and
    the first semiconductor chip being stacked over the second semiconductor chip; and
    an electrode of a fixed potential disposed over a surface of the first semiconductor chip on the side opposed to the second semiconductor chip,
    wherein the electrode of a fixed potential is electrically connected to the semiconductor substrate of the first semiconductor chip and to the wiring substrate.

11. A semiconductor device according to claim 10, wherein the second semiconductor chip and the wiring substrate are connected with each other through an electrically conductive wire.

12. A semiconductor device according to claim 10, wherein a spacer is disposed between the first and second semiconductor chips.

13. A semiconductor device according to claim 12, wherein the electrode of a fixed potential is disposed over the spacer on the side thereof opposed to the first semiconductor chip.

* * * * *